United States Patent [19]

Hall

[11] 4,242,631
[45] Dec. 30, 1980

[54] FRONT-END CIRCUIT APPARATUS FOR IMPEDANCE MEASUREMENTS AND THE LIKE

[75] Inventor: Henry P. Hall, Concord, Mass.

[73] Assignee: GenRad, Inc., Concord, Mass.

[21] Appl. No.: 911,367

[22] Filed: Jun. 1, 1978

[51] Int. Cl.³ ...................... G01R 27/02; G01R 27/00
[52] U.S. Cl. .................................. 324/62; 324/57 R; 324/61 R; 324/DIG. 1
[58] Field of Search ..................... 324/62, 57 R, 61 R, 324/DIG. 1, 128

[56] References Cited

U.S. PATENT DOCUMENTS

| 2,479,051 | 8/1949 | Sunstein | 324/DIG. 1 |
|---|---|---|---|
| 2,589,758 | 3/1952 | Wojciechowski | 324/DIG. 1 |
| 2,593,175 | 4/1952 | Packard et al. | 324/57 R |
| 3,027,511 | 3/1962 | Farr | 324/DIG. 1 |
| 3,031,614 | 4/1962 | Calvert | 324/57 R |
| 3,422,347 | 1/1969 | Cox | 324/DIG. 1 |
| 3,585,496 | 6/1971 | Ichijo | 324/57 R X |
| 3,718,856 | 2/1973 | Hendriks | 324/57 R |
| 3,784,906 | 1/1974 | Ironside | 324/62 |
| 3,786,350 | 1/1974 | Munt | 324/62 |
| 3,873,917 | 3/1975 | Kreuzer | 324/62 |

OTHER PUBLICATIONS

Bode, H. W., "Network Analysis and Feedback Analysis Design"; Van Nostrand; 1945, p. 223.
GR1657-RLC "Digibridge" Instruction Manual; Gen--Rad Inc.; Jan. 1978.
Gipe et al; "Microprocessor Simplifies Impedance Measurements"; Wescon/76; Session 1; Paper 4.

Primary Examiner—Ernest F. Karlsen
Attorney, Agent, or Firm—Rines and Rines, Shapiro and Shapiro

[57] ABSTRACT

This disclosure is concerned with a novel front-end circuit for impedance measuring circuits and the like, involving separately or alternately operated grounding switches for connecting the free terminals of unknown and standard impedances, series-connected at a common terminal, to ground, for enabling separate selected voltage measurements between the unknown and standard, and with the series-connected impedances fed from a floating transformer; the circuit avoiding errors due to low switch impedances and obviating dependence upon capacitance from either side of the unknown impedance to ground and upon the series impedance involved in connections or leads to the unknown impedance.

10 Claims, 6 Drawing Figures

FRONT-END CIRCUIT APPARATUS FOR IMPEDANCE MEASUREMENTS AND THE LIKE

The present invention relates to impedance measuring and similar circuits and apparatus, being more particularly concerned with improvements in the measurement head or front-end circuit portions thereof that supply precision voltages to detecting circuits and the like.

As described, for example, by H. W. Bode in "Network Analysis and Feedback Analysis Design", Van Nostrand, 1945, p. 223 and elsewhere, the transmission ratio [i.e. output-to-input voltage (Eo/Ein)] of a linear network circuit can be expressed in the form $$\frac{Eo}{Ein} = \frac{AZ_x + B}{Z_x + C},$$

where $Z_x$ is the impedance of the network, and A, B and C are constants that can be determined by replacing $Z_x$ with three standard impedance of known value, measuring the three respective resulting transmission ratios, and making a calculation. Such a technique has been used to measure impedance, particularly at high frequencies, and has been employed in computer-controlled systems as described, for example, by W. J. Geldart, "Improved Impedance Measuring Accuracy With Computer-Operated Transmission Measuring Sets", IEEE Trans. Inst. & Meas., Dec., 1975, p. 327, etc. Such techniques have usually been applied to measuring grounded components, however, and not the more generalized problem of floating components and the like; and in other applications cannot tolerate impedance to ground.

Many types of impedance measuring circuits have been proposed and used throughout the years, but with susceptibility to errors and difficulties arising from stray reactances and other errors introduced in switching connections, critical dependence on capacitance from either side of the unknown impedance $Z_x$ to ground, criticality to small series impedances in the connections or leads to the unknown, criticality of the detector impedance, and similar problems. Among the prior attempts to solve or alleviate one or more of the above difficulties are the systems disclosed in U.S. Letters Pat. Nos. 3,718,856 and 3,775,678, dealing, respectively, with modulating a high-frequency current alternately with the unknown impedance and a reference impedance and with synchronous detection, and a pair of meters using diodes as rectifiers rather than as switches to provide dc that is a measure of impedance magnitude. While such techniques reduce the sensitivity to some stray reactances, they do not solve the total problem of the present invention. In U.S. Pat. No. 3,718,856, as an example, either the standard or the unknown circuit is at any one time switched to the source and the source to ground, passing current alternately into an amplifier, and with the impedance of the detector adding directly to that of the standard or unknown such that the system is critical to detector impedance.

Other references using switching connections and/or discussing or attempting to alleviate or minimize some of the problems before discussed, are U.S. Letters Pat. Nos. 3,786,349; 3,851,641; 3,949,736; 4,038,975; British Pat. No. 1,250,155; and my article "An AC-DC Ratiometer And Its Use In A CRL Meter", IEEE Trans. Instr. & Meas. Vol. IM-22, No. 4, Dec. 1973, pp. 387–390; Domingo et al, "Instrument for Automatic Kilovolt Pulsed Measurement of Electronic Properties", Rev. Sci. Instr., Vol. 46, No. 2, Feb. 1975, pp. 147–151; and Lakes et al, "Low-Frequency Dielectric Bridge", Rev. Sci. Instr., Vol. 46, No. 11, Nov. 1975, pp. 1583–1586. In none of the above, however, is an approach employed of the type embodied by the present invention, and the novel results attainable by such invention are not achieved.

Specifically, it is an object of the present invention to provide a new and improved impedance measurement apparatus embodying a novel measurement head or front-end circuit that renders the precision voltages it supplies to subsequent detecting circuits which are proportional to the impedance being measured and to a standard impedance, highly immune to impedance from either terminal of such unknown and standard impedances to ground and also highly immune to series impedances of the connecting leads; thus obviating all the before-described difficulties with prior art systems, providing independence of detector impedance, and providing an improved measurement circuit capable of both good three-terminal or guarded measurements and good four terminal or Kelvin-type measurements, as well.

A further object is to provide such a novel front-end circuit apparatus that is particularly, though not exclusively, advantageous at high frequencies (say, 1 MHz and above), and that requires no common-mode rejection or high-performance operational amplifiers, and, additionally, can be built into a compact probe assembly of few active circuit elements that can be brought directly up to the device being measured to minimize connection impedances.

An additional object is to provide an improved front-end circuit that can be used to advantage in impedance meters and similar apparatus of many types.

Other and further objects are explained hereinafter and are more particularly delineated in the appended claims.

In summary, from one of its important aspects, the invention embraces front-end circuit apparatus for impedance measuring circuits and the like having, in combination, input ac coupling transformer means; unknown and standard impedance means sharing a common terminal of series-connection there between and with their other terminals connected to the transformer means; a pair of grounded switching means, one connected to each of the said other terminals of the respective unknown and standard impedance means; means for selectively switching each of the pair of switching means correspondingly to ground said other terminals; and isolating amplifier means having its input connected to the said common terminal and its output adapted for connection to detector means. Details are later discussed.

The invention will now be described with reference to the accompanying drawings, FIG. 1 of which is a simplified schematic diagram illustrating the underlying principles of the invention;

Figure 1:
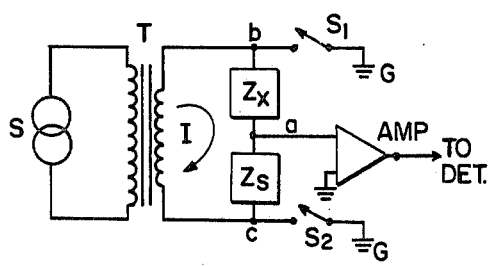

Before referring to the drawings, it should be recalled that at low frequencies (say of the order of up to a few KHz), high-gain operational amplifiers may be used in impedance meters and the like to provide a virtual ground at a terminal of the unknown impedance which minimizes the shunt capacitance from this point to ground and greatly reduces the common-mode rejection required of differential amplifiers feeding the detector circuit. An example of such circuits is described in the GR1657-RLC "Digibridge" Instruction Manual of the assignee of this application, GenRad, Inc., Jan., 1978. A four-terminal connection to the unknown impedance can eliminate the effect of series impedance in the test signal path, such as contact resistance. Switching to measure unknown and standard voltages sequentially, is conveniently done at the outputs of the differential amplifiers. At much higher frequencies, however, the performance required of the various amplifiers makes this approach impractical.

In accordance with the present invention, on the other hand, a front-end circuit of quite different configuration and operation is provided that retains many of the performance features of such lower-frequency circuits, but is highly advantageous at the higher frequencies, such as 1 MHz and above. Referring to FIG. 1, an input circuit step-down transformer T is shown coupling a high frequency or other source S to the measurement head or front-end circuit containing the unknown impedance Zx and the standard impedance Zs series connected at common terminal a, and with the other terminals connected across the secondary winding of the transformer T at b and c.

The principles underlying the invention are illustrated as effected with a pair of grounded (G) sequentially operated switches schematically shown at $S_1$ and $S_2$, connectable to points b and c, respectively. When switch S1 is closed, S2 is open. It presents a voltage $-IZ_x$ to the high-input impedance isolating or buffer amplifier AMP applied to the detecting circuits, labelled "To DET". When S2 is closed, S1 is open, and it presents a voltage $IZ_s$ to the amplifier AMP.

The ratio of these voltages is $$\frac{-IZ_x}{IZ_s} = \frac{-Z_x}{Z_s}.$$

If this division is made, $Z_x$ may be determined if $Z_s$ is known, the division being a complex division. The gain or phase shift of the amplifier AMP does not affect the ratio of voltages appearing at its output Eo so long as that gain is constant for the time interval of the pair of separate measurements. This is particularly important at higher frequencies where precision circuitry is difficult to achieve.

The input impedance to the amplifier AMP, or any other impedance from the common terminal or junction a of $Z_x$ and $Z_s$ to ground, causes no direct error. If such an impedance, $Z_L$, is present for both measurements, the ratio of the two voltages is still $-Z_x/Z_s$, as before, though the current will not necessarily be constant for the two measurements.

Figure 2:
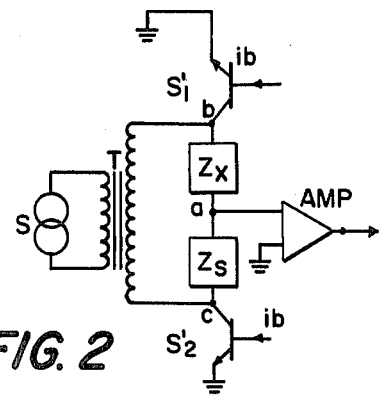
FIGS. 2 and 3 are circuit diagrams of a preferred embodiment.

The connection of both switches $S_1$ and $S_2$ to ground G allows the use of bipolar low-resistance junction transistors or the like as switches since ground is a good "sink" for the required base currents. Such junction transistors $S_1'$ and $S_2'$ are shown in FIG. 2, (2N3414 type, for example) having saturation resistance of one ohm or less when the base current $i_b$ is 10 mA. When such a low resistance switch is used, impedance shunting the closed switch has little effect. This provides a low $\omega RC$ product (where $\omega$ is the angular frequency) and negligible error from this source. Thus, impedance from point b to ground has little effect when $S_1'$ is closed and that from point c to ground has little effect when $S_2'$ is closed.

When the corresponding switches are open, such impedances can still have little effect if the impedance of the voltage source is low. This may be accomplished in two ways: either the voltage source S and transformer T may have low impedances, or the transformer secondary may be shunted by a low impedance, shown as Rg in FIG. 6. Rg, (if used), is made as low as possible to minimize capacitive loading effects at each terminal of the transformer secondary winding. If these switch and source impedances are all low, thus, the circuit makes a good three-terminal measurement independent of shunt-loading impedances.

Figure 3:
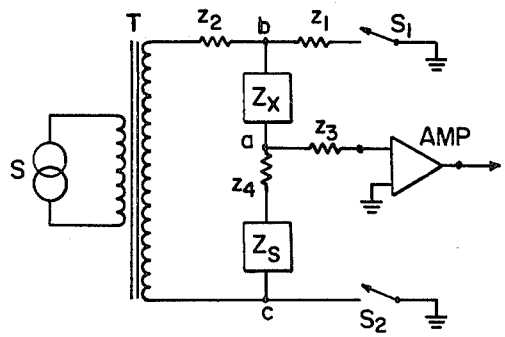

The circuit of FIG. 1 is redrawn in FIG. 3 to emphasize that there are actually four connections to the unknown, each with a series impedance ($z_1$ to $z_4$). The series elements $z_1$ and $z_2$ are respectively connected from point b to the switch $S_1$ and the upper terminal of the secondary winding of T; $z_3$ is in the path from point a to AMP; and $z_4$ is in the connection from point a to $Z_s$. If there is no shunt loading, no current flows in $z_1$ when $S_1$ is closed; and hence $z_1$ has no effect. The impedance $z_2$ changes the current I slightly, but has no effect on the ratio $IZ_x/IZ_s$. The impedance $z_3$ is in the input of amplifier AMP and has little effect if the amplifier input impedance is high. The impedance $z_4$ adds to $Z_s$, thus causing an appreciable error unless $z_4/Z_s$ is negligible. In one typical application, $Z_s$ may be a 1KΩ resistor, and a little connection resistance is therefore negligible compared to it. As a result, a reasonable impedance in any of the four leads has negligible error, and a good four-terminal, Kelvin measurement is made.

Figure 4:
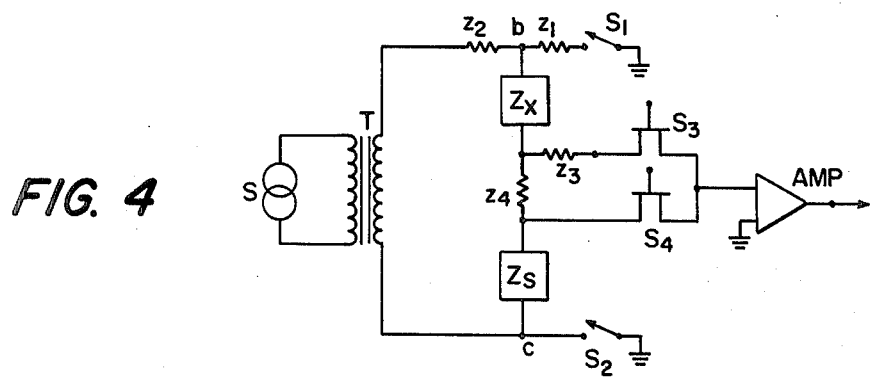
FIG. 4 is a circuit diagram of a modification of the circuits of FIGS. 2 and 3.

If the ratio $z_4/Z_s$ is not negligible, on the other hand, the effect of $z_4$ can be removed by adding two further switches $S_3$ and $S_4$ on opposite sides of $z_3$ and $z_4$, as shown in FIG. 4. These may, for example, be FET switches, as shown, because their "on" impedance need not be particularly low. Here, if $S_1$ and $S_3$ are closed at the same time, the voltage $-IZ_x$ is accurately presented to the amplifier AMP; and if $S_2$ and $S_4$ are closed, the voltage $IZ_s$ is accurately presented.

Figure 5:
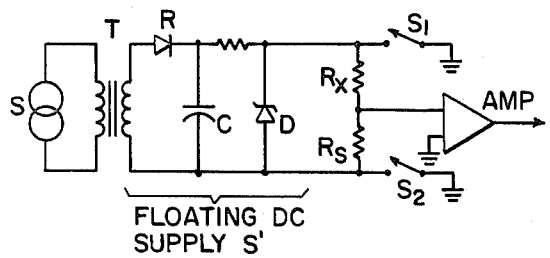
FIG. 5 is a further modification for DC operation.

The simple type of circuit of the invention is particularly useful for higher frequencies, as before explained, where the open loop gain of operational amplifiers is insufficient to provide adequate feedback for precise differential amplifiers, or any amplifier with precise gain or phase. While particularly advantageous at high frequencies, it is also useful over a wide range of frequencies, even down to dc, as shown more particularly in FIG. 5 in connection with an unknown resistance Rx and a standard resistance Rs. An input transformer T can also isolate a floating dc supply, S', rectifying and storing dc from the source S by rectifier R, capacitor C and regulating zener diode D, such that either side of the supply can be grounded.

The front-end circuit of the invention, moreover, may be used with many different types of detecting and ratio circuits, such as, for example, circuits similar to that described in my earlier-referenced article, or in the before-described U.S. Letters Pat. No. 3,718,856, as another illustration. Another useful application for the invention is in impedance bridges such as the said GR 1657 impedance measuring bridge, using an ac phase-sensitive, dual-slope analog-to-digital converter as a detector and a microprocessor to make the complex division, but with a higher test frequency, such as 1 MHz.

Figure 6:
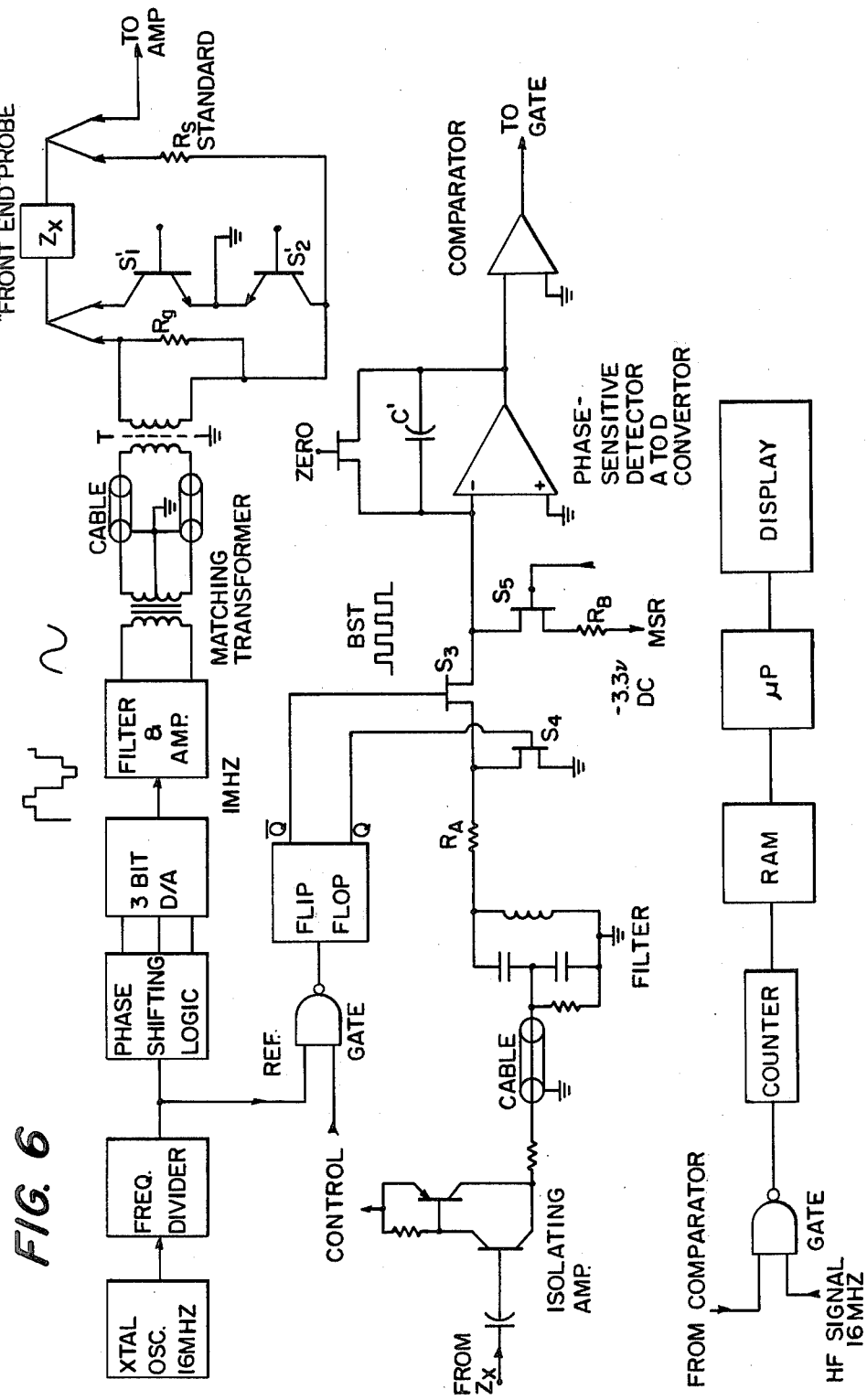
FIG. 6 is a circuit diagram of the front-end circuit of the invention embodied in an impedance bridge employing an ac phase-sensitive detector and a microprocessor for effecting complex division.

A basic diagram of such a 1 MHz impedance meter is shown in FIG. 6. In this application, the "front end" circuit may be contained in a small probe that is connected to the main instrument by approximately 1 m of cable, so-labelled. This is done to allow this measurement circuit to be placed close to a mechanical component sorting device or other component being measured.

The operation of this instrument is briefly described below, with reference to FIG. 6, but with details, unnecessary to an understanding of the front-end circuit of the invention, omitted; the same being available in the before-mentioned GR 1657 Instruction Manual and in my article entitled "Analog Tests: The Microprocessor Scores", appearing in the IEEE Spectrum, Vol. 14, No. 4, April, 1977, pp. 36–40; and in my article with M. A. Gipe and R. Sullivan, "Microprocessor Simplifies Impedance Measurements", WESCON/76, Session 1, Paper 4.

A 16-MHz crystal frequency-controlled oscillator signal XTAL OSC is divided (FREQ. DIVIDER) to several lower frequencies (1, 2, 4, and 8 MHz) from which a stepwise approximation to a 1-MHz sinusoidal wave is obtained with a simple digital-to-analog converter later discussed. A 1 MHz reference is also obtained. By means of logic circuitry, the relative phase of the approximated sine wave can be shifted with respect to the reference by 90° increments to give any one of four relative phase positions, as later summarized.

This signal is filtered and amplified and driven through a "cable" to the measurement head or "front end probe". The front-end circuit is similar to that of FIGS. 1, 2 and 3, embodying the unknown Zx, and switches $S_1'$ and $S_2'$. The before-mentioned low-impedance shunt for the secondary winding of the transformer T is illustrated at Rg. When switch $S_1'$ is closed, several measurements are taken. The front end output is isolated by a unity-voltage-gain amplifier which drives a cable that carries the signals back to the main part of the instrument where it is filtered and detected.

The detector, labelled "PHASE-SENSITIVE DETECTOR", is a gating-type phase-sensitive detector that also acts as a dual-slope analog-to-digital converter labelled "A to D CONVERTER". The reference square-wave pulses BST open $S_3$ and allow signal current to flow into the integrating capacitor C'. The amount of charge entering this capacitor C' depends on the amplitude of the component of the signal that is in phase with the reference pulses used. It also depends on the number of pulses. A burst BST of 1 MHz pulses may be used which lasts 1/60 of a second, so that the detector is immune to 60 Hz power-line pickup. After the capacitor C' has been charged to a value proportional to a phase component of the signal, it is discharged by a constant dc current through $R_B$ controlled by a MSR pulse. This pulse length extends until the comparator indicates that the capacitor C' is discharged; a time period that is proportional to the detected signal level.

This time period is measured as a number of counts of a high-frequency signal in the "COUNTER". This count is therefore a measure of a component of the detected signal. This count is stored in the RAM memory shown connected to the COUNTER.

A total of eight measurements is made; four on the voltage across $Z_x$ ($S_1$ closed), and four on the voltage across $R_s$. Both groups of four measurements are made with four 90°-displaced signals (i.e., 0°, 90°, 180°, 270°).

The digital results of opposite signals (i.e., 0° and 180°) are substracted, thus cancelling dc offsets and leaving four remaining numbers which represent the two quadrature components of the two signals. The complex ratio of these is equal to $Z_x/R_s$. This complex division is done by the microprocessor "$\mu P$". From stored calibration data as to the value and phase angle of $R_s$ and from the precisely known frequency, it is possible for the microprocessor $\mu P$ to calculate such quantities as $C_x$, $L_x$, $D_x$, $Q_x$, $R_x$, etc., where the subscript x refers to the unknown.

While, as before stated, this description of operation of the complete meter of FIG. 6 is a summary, with the details on how the various control signals are generated, etc., being beyond the purpose of this application, it should be noted that the overall measurement is controlled by a program stored in ROM memory and initiated by the microprocessor $\mu P$, and that separate logic circuitry is required when the speed requirements exceed the speed of the microprocessor. It also should be noted that calibration data from measurements on external standards is stored in RAM memory and applied to each measurement. Further details are contained in the previously referenced publications incorporated herein by reference. The full details of the front-end circuit of the invention as incorporated into this frequency meter have been presented and it is these that are germane to the present invention.

Further modifications will occur to those skilled in this art, and such are considered to fall within the spirit and scope of the invention as defined in the appended claims.

What is claimed is:

1. Front-end circuit apparatus for impedance measuring circuits and the like having, in combination, input ac coupling transformer means; unknown and standard impedance means sharing a common terminal of series-connection therebetween and with their other terminals connected to the transformer means; a pair of grounded switching means, one connected to each of the said other terminals of the respective unknown and standard impedance means; means for selectively switching each of the pair of switching means correspondingly to ground said other terminals; and isolating amplifier means having its input connected to the said common terminal and its output adapted for connection to detector means.

2. Front-end circuit apparatus as claimed in claim 1 and in which said pair of switching means comprises a pair of bipolar low-resistance junction transistor means connected alternately to ground opposite terminals of a secondary winding of the transformer means.

3. Front-end circuit apparatus as claimed in claim 1 and in which both the switching means, when operative, and the said input ac coupling transformer means are adjusted to present low impedances, compared with the unknown and standard impedance means, thereby adapting the said circuit for good three-terminal measurement independent of shunt-loading impedances.

4. Front-end circuit apparatus as claimed in claim 1 and in which four connections to the terminals of the unknown impedance means, namely, from the transformer means and from the switching means to the said other terminal of the unknown impedance means, and from the said common terminal to the standard impedance means and to the said amplifier means, have their series impedance selected to provide negligible error, thereby enabling good four-terminal Kelvin-type measurement.

5. Front-end circuit apparatus as claimed in claim 4 and in which further switching means are provided in connections to the said amplifier means from opposite terminals of the series impedance in the said connection from the said common terminal to the standard impedance means.

6. Front-end circuit apparatus as claimed in claim 1 and in which rectifier means is interposed between said transformer means and said series-connected unknown and standard impedance means to provide a floating dc supply, and said unknown and standard impedance means comprise unknown and standard resistance means.

7. Front-end circuit apparatus as claimed in claim 2 and in which a resistance is connected across said secondary winding the impedance of said resistance being small compared with that of the unknown and standard impedance means.

8. Front-end circuit apparatus as claimed in claim 2 and in which the ac frequency coupled by said transformer means is of the order of MHz, and said standard impedance means comprises a standard resistance.

9. Front-end circuit apparatus as claimed in claim 2 and in which the same is provided in a probe connected by a length of cable to a source of ac to allow placing the front-end circuit close to the device being measured to minimize connection impedances.

10. Front-end circuit apparatus as claimed in claim 2 and in which the same is connected as the measurement head of an impedance meter having a frequency-controlled ac source connected to the transformer means, an ac phase-sensitive dual-slope analog-to-digital converter as the detector means connected to said isolating amplifier means, and microprocessor means connected with the detector means to effect complex division for computing impedance from voltage measurements made in the said impedance meter.

* * * * *